United States Patent [19]

Robertson

[11] Patent Number: 4,926,396

[45] Date of Patent: May 15, 1990

[54] HIGH PRESSURE TRANSDUCER

[75] Inventor: Bob K. Robertson, Stafford, Tex.

[73] Assignee: Teledyne Exploration, Houston, Tex.

[21] Appl. No.: 418,574

[22] Filed: Oct. 10, 1989

[51] Int. Cl.[5] .......................... H01L 41/08; H04R 17/00

[52] U.S. Cl. .......................... 367/159; 367/165; 310/337

[58] Field of Search .......................... 310/337, 345, 353, 369; 367/157, 159, 162, 165, 167, 172

[56] References Cited

U.S. PATENT DOCUMENTS

| | | | |
|---|---|---|---|
| 3,739,326 | 6/1973 | Kerr et al. | 340/10 |
| 3,828,143 | 8/1974 | Tims et al. | 367/159 |
| 3,860,901 | 1/1975 | Ehrlich et al. | 367/159 |
| 4,162,476 | 7/1979 | Fanning | 340/7 R |
| 4,674,067 | 6/1987 | Zemanek, Jr. | 367/159 X |
| 4,737,939 | 4/1988 | Ricketts | 367/165 |
| 4,862,428 | 8/1989 | Jackett et al. | 367/162 |

OTHER PUBLICATIONS

Gulton Industries Inc., Brochure; Glennite Piezo Ceramics, p. 25.

*Primary Examiner*—Brian S. Steinberger
*Attorney, Agent, or Firm*—William A. Knox

[57] ABSTRACT

In a tubular pressure transducer element, the axial stress imparted to the element is reduced relative to the radial stress by inserting a rigid core inside the tubular element. The reduction in stress is proportional to the ratio between the area of the full diameter of the tubular element and the area of the annulus represented by the wall thickness of the tubular element.

2 Claims, 1 Drawing Sheet

HIGH PRESSURE TRANSDUCER

BACKGROUND OF THE INVENTION

1. Field of the Invention

This invention is concerned with transducers for use under great hydrostatic pressures. In particular, it is directed towards reducing the rate of change in power sensitivity of a piezoelectric transducer as a function of increasing pressure.

2. Discussion of the Prior Art

Piezoelectric transducers of various configurations are extensively used is seismic exploration, in acoustic tracking of submarines in the deep ocean and even for recording the conversations of whales. Variations in acoustic pressure produce an electrical output from the transducers, measured in the range of microvolts to millivolts.

For use in hyperbaric environment on the order of 10,000 psi, and for good and sufficient design reasons, piezoelectric transducer elements in the form of a right cylinder are preferred. The right cylinder is sealed at each end by an end plate, leaving an internal air space. Use of such a tubular transducer element, for example, is shown in U.S. Pat. No. 4,162,476 as reference numeral 1 of FIGS. 1 and 4 of the patent drawings. The cylinder is closed at each end by end plates 2 and 3 of the drawings. It is apparent that the axial stress applied to the cylindrical element 1 is equal to the full area of the end plates multiplied by the ambient static pressure (for purposes of this discussion, we shall ignore the presence of the accelerometer element shown in the figures of that reference). It is to be presumed that the static pressure is uniformly distributed around the element.

Another version of a tubular or cylindrical transducer is found in U.S. Pat. No. 3,739,326. Here, the transducer is wrapped around the stress member of a streamer cable and is held in place by end caps. The end caps present an area to axial forces much larger than the full diameter of the transducer element and therefore do not minimize the axial stress relative to the radial stress.

I have found, from laboratory measurements and field tests, that the capacitance, and hence the sensitivity or power output, of commercially available tubular ceramic piezoelectric transducers diminishes non-linearly with increasing water depth or pressure. In an off-the-shelf commercial unit, the drop in power sensitivity was 63% over a range of static pressures from atmospheric to 10,000 psi.

From further laboratory tests, I have found that whereas the capacitance of a tubular ceramic transducer increases with increasing *radial* stress, its capacitance diminishes with increasing *axial* stress. My tests show that the rate of change of diminishing capacitance due to axial stress is much greater than the rate of change of increasing capacitance due to radial stress. The net result therefore, of an increasing uniform pressure field around the transducer element is a lowering of its capacitance as explained above.

It is a purpose of this invention to provide a transducer element suitable for use at high ambient pressures, whose rate of change in power sensitivity as a function of pressure is minimized.

SUMMARY OF THE INVENTION

In accordance with an aspect of this invention, I provide a tubular ceramic piezoelectric transducer element of a design such that the axial stress applied to the tubular element is minimized with respect to the radial stress applied to the element when the tubular element is subjected to a hyperbaric pressure field that is applied uniformly around the transducer element. To that end, I insert a rigid core into the tubular element. The end faces of the core are flush with the end faces of the tubular element. Preferably, the core is resiliently mounted inside the tubular element with a small air space between the core and the inner diameter of the tubular element. The assembly is covered with a suitable rigid encapsulant.

BRIEF DESCRIPTION OF THE DRAWINGS

The benefits and advantages of this invention will be better understood by reference to the detailed description and the drawings wherein.

DETAILED DESCRIPTION OF THE PREFERRED EMBODIMENT

Figure 1:
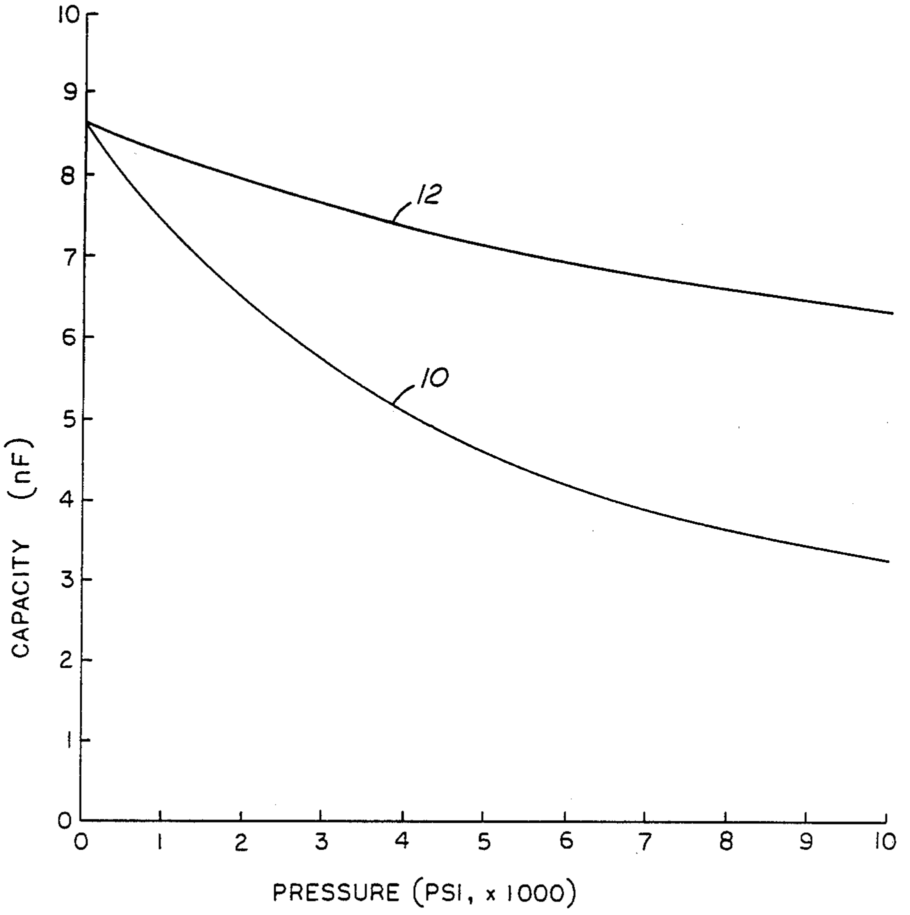
FIG. 1 shows the changes in capacitance of a conventional transducer as opposed to the capacitance changes of the same transducer but including the core of this invention, plotted as a function of an increasing uniform pressure field.

In FIG. 1, there is shown a curve 10 wherein is plotted the capacitance of a conventional tubular ceramic piezoelectric transducer as a function of a uniformly-applied pressure field ranging from atmospheric to 10,000 psi. The diminution in capacitance and hence the power output is 63%, more than a 6-dB loss. By contrast, curve 12, representing the output of the same transducer, but including the core of this invention, shows a power loss of less than half that amount. Using the teachings of my invention, the rate of change in capacitance and hence power output, as a function of pressure is significantly less than the rate of change exhibited by a conventional transducer.

Figure 2:
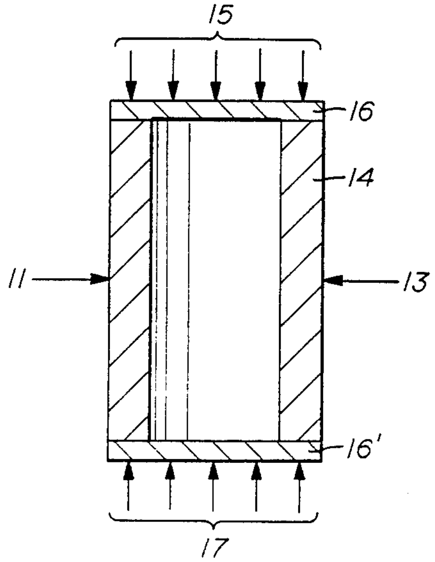
FIG. 2 (PRIOR ART)
FIG. 2 is a schematic drawing of a prior-art tansducer element.

FIG. 2 is an over-simplified diagram of a typical prior-art tubular ceramic piezoelectric transducer. As may be appreciated from the drawing, the axial stress applied to the tubular element 14 is equal to the full area of the end cap 16 multiplied by the ambient pressure as shown symbolically by the collective group of arrows 15 and 17.

Figure 3:
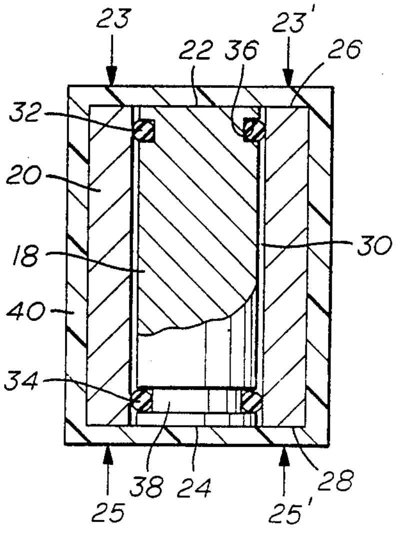
FIG. 3 is a schematic drawing of the transducer element of this invention.

In FIG. 3, my presently preferred design, a rigid core 18, which may be made of some metal such as aluminum or of a rigid plastic, is inserted into the tubular element 20. The end faces 22 and 24 of the core are flush with the end faces 26 and 28 of the tubular element 20.

I prefer that the core 18 be resiliently mounted inside tubular element 20 such as by O-rings 32 and 34 that are mounted in grooves such as 36 and 38 around core 18. If the core is metallic, the O-rings also serve as insulators. It is necessary to provide a small but minimal air space 30 between the outer diameter of the core and the inner wall surface of the tubular element. I provide a clearance between the outer diameter (OD) of the core 18 and the inner diameter (ID) of the tubular element 20 of less than one-fifth of the wall thickness of the tubular element, or in the case of my preferred exemplary design, about 0.005 inch. The O-rings serve as standoffs to provide the desired air space 30.

The entire unit is encapsulated with a suitable rigid plastic covering 40, such as Scotch-cast #4. The encapsulating material itself, covering the opposite ends of the element, serves in place of the prior-art, separate, end caps. Because the encapsulating material is rigid, it transmits the stresses, due to an applied pressure field, to the ceramic element both axially and radially. But the net axial stress is minimized relative to the radial stress because of the presence of the core. The reduction in axial stress provided by my invention relative to the prior art is proportional to the ratio between the the area of the full OD of the tubular element and the area of the annulus represented by the wall thickness of the tubular element as shown by the single arrows 23—23' and 25—25'.

As is customary in the art, metallic coatings are plated over the inner and outer wall surfaces of the tubular piezoelectric element to act as electrodes; the element is polarized and electrical output leads (not shown) are soldered to the electrodes.

The rigid core provides a means for minimizing the axial stress applied to the opposite end faces of a tubular ceramic piezoelectric transducer element when it is subjected to a uniformly applied hyperbaric pressure field.

I have thus provided a method for substantially minimizing the magnitude of the axial stress relative to the radial stress that is applied to a tubular ceramic piezoelectric transducer element when the element is subjected to a pressure field that is applied uniformly around the transducer.

Those skilled in the art will recognize that variations may be made in the design of my pressure transducer but that such design changes will fall within the scope and spirit of this invention which is limited only be the appended claims.

I claim as my invention:

1. A pressure transducer comprising:

a tubular ceramic piezoelectric element having opposite end faces and inner and outer wall surfaces;

means for minimizing an axial stress applied to said opposite end faces of said tubular ceramic piezoelectric element when the pressure transducer is subjected to a uniform pressure field;

said means for minimizing including a rigid core having an outer wall surface, mounted inside said tubular ceramic piezoelectric element, said core having opposite end faces that are flush with the opposite end faces of the tubular element, the clearance between the outer wall surface of said rigid core and the inner wall surface of said tubular element being less than one fifth of the wall thickness of said tubular element; and a rigid encapsulating material enclosing said tubular ceramic piezoelectric element and said rigid core.

2. The pressure transducer as defined by claim 1, comprising:

means for resiliently mounting said rigid core within said tubular element; and standoff means for providing an air space between said rigid core and said inner wall surface of said tubular element.

* * * * *